United States Patent
Fukasawa et al.

(10) Patent No.: US 11,901,737 B2
(45) Date of Patent: Feb. 13, 2024

(54) DISTRIBUTED-POWER-SUPPLY POWER CONVERSION SYSTEM

(71) Applicant: TOSHIBA MITSUBISHI-ELECTRIC INDUSTRIAL SYSTEMS CORPORATION, Chuo-ku (JP)

(72) Inventors: Issei Fukasawa, Tokyo (JP); Tatsuaki Ambo, Tokyo (JP); Ruben Alexis Inzunza Figueroa, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 101 days.

(21) Appl. No.: 17/754,549

(22) PCT Filed: Feb. 7, 2020

(86) PCT No.: PCT/JP2020/004968
§ 371 (c)(1),
(2) Date: Apr. 5, 2022

(87) PCT Pub. No.: WO2021/157087
PCT Pub. Date: Aug. 12, 2021

(65) Prior Publication Data
US 2023/0261472 A1    Aug. 17, 2023

(51) Int. Cl.
*H02J 3/38* (2006.01)
*G01R 31/40* (2020.01)
*H02M 7/493* (2007.01)

(52) U.S. Cl.
CPC ............... *H02J 3/38* (2013.01); *G01R 31/40* (2013.01); *H02M 7/493* (2013.01); *H02J 2300/24* (2020.01)

(58) Field of Classification Search
CPC ........ H02J 3/38; H02J 2300/24; G01R 31/40; H02M 7/493
(Continued)

(56) References Cited

U.S. PATENT DOCUMENTS

| 6,947,300 B2 | 7/2005 | Pai et al. |
| 2005/0286274 A1* | 12/2005 | Pfitzer ................... G01R 31/40 363/37 |

(Continued)

FOREIGN PATENT DOCUMENTS

| JP | 10-201105 A | 7/1998 |
| JP | 2019-122180 A | 7/2019 |
| WO | WO 2016/157632 A1 | 10/2016 |

OTHER PUBLICATIONS

Office Action dated Sep. 21, 2022, in corresponding Indian Patent Application No. 202217020027 (with English Translation), 6 pages.

(Continued)

*Primary Examiner* — Alfonso Perez Borroto
(74) *Attorney, Agent, or Firm* — Oblon, McClelland, Maier & Neustadt, L.L.P.

(57) ABSTRACT

A distributed-power-supply power conversion system includes a plurality of power inverters configured to invert DC power to AC power; and a control device configured to select at least one power inverter from the plurality of power inverters as a power inverter used for testing, and configured to perform an energization test of the power inverter used for testing in a state where an AC side of the power inverter used for testing is disconnected from a system, and is connected to an AC power supply device and to a load bank, and a voltage on the AC side of the power inverter used for testing is established. The distributed-power-supply power conversion system can perform an energization test of a power inverter before a system receives power.

3 Claims, 4 Drawing Sheets

(58) Field of Classification Search
USPC .......................................................... 307/69
See application file for complete search history.

(56) References Cited

U.S. PATENT DOCUMENTS

| 2010/0327901 | A1* | 12/2010 | Xie | G01R 31/42 |
| | | | | 324/764.01 |
| 2013/0271115 | A1* | 10/2013 | Li | G01R 31/42 |
| | | | | 324/114 |
| 2018/0102651 | A1 | 4/2018 | Pant et al. | |

OTHER PUBLICATIONS

International Preliminary Report on Patentability and Written Opinion dated Aug. 18, 2022, in PCT/JP2020/004968, 7 pages.
Australian Office Action dated Jul. 26, 2023 in Australian Patent Application No. 2020426967, 2 pages.
International Search Report and Written Opinion dated Apr. 7, 2020 in PCT/JP2020/004968 filed on Feb. 7, 2020, (total 12 pages).
The extended European search dated Oct. 9, 2023 in corresponding European Patent Application No. EP 20 91 7907.6 (7 pages).

* cited by examiner

DISTRIBUTED-POWER-SUPPLY POWER CONVERSION SYSTEM

FIELD

This invention relates to a distributed-power-supply power conversion system.

BACKGROUND

PTL 1 discloses a distributed-power-supply power conversion system. With the use of this distributed-power-supply power conversion system, when a plurality of power conversion devices are operated by one common control device, operation control information can be transmitted without providing a dedicated signal line.

CITATION LIST

Patent Literature

[PTL 1] JP H10-201105 A

SUMMARY

Technical Problem

However, in the distributed-power-supply power conversion system disclosed in PTL 1, the energization test of the power inverter is performed after the system starts to receive power. Therefore, if it takes a long time to prepare a power receiving facility in the system, the energization test of the power inverter cannot be performed. As a result, there is a delay in the start of selling power.

This invention has been made to overcome the above-mentioned problem. It is an object of this invention to provide a distributed-power-supply power conversion system which can perform the energization test of the power inverter before the system receives power.

Solution to Problem

A distributed-power-supply power conversion system according to this invention includes: a plurality of power inverters configured to invert DC power to AC power; and a control device configured to select at least one power inverter from the plurality of power inverters as a power inverter used for testing, and configured to perform an energization test of the power inverter used for testing in a state where an AC side of the power inverter used for testing is disconnected from a system, and is connected to an AC power supply device and to a load bank, and a voltage on the AC side of the power inverter used for testing is established.

A distributed-power-supply power conversion system according to this invention includes: a plurality of power inverters configured to invert DC power to AC power; and a control device configured to select at least one power inverter from the plurality of power inverters as a power inverter used for maintaining voltage, configured to select, from the plurality of power inverters, at least one power inverter different from the power inverter used for maintaining voltage as a power inverter used for testing, and configured to perform an energization test of the power inverter used for testing in a state where a voltage on the AC side of the power inverter used for maintaining voltage is maintained at a constant value, an AC side of the power inverter used for maintaining voltage and an AC side of the power inverter used for testing being disconnected from a system, and being connected with each other.

A distributed-power-supply power conversion system according to this invention includes: a plurality of power inverters configured to invert DC power to AC power; and a control device configured to select at least one power inverter from the plurality of power inverters as a power inverter used for regeneration, configured to select, from the plurality of power inverters, a power inverter different from the power inverter used for regeneration as a power inverter used for testing, and configured to perform an energization test of the power inverter used for testing, an AC side of the power inverter used for regeneration and an AC side of the power inverter used for testing being disconnected from a system, and being connected with each other, the control device selecting, as the power inverter used for regeneration, the power inverter having a DC side to which a photovoltaic power generation facility is connected, selecting, as the power inverter used for testing, the power inverter having a DC side to which the photovoltaic power generation facility is connected and, in a state where the AC side of the power inverter used for regeneration and the AC side of the power inverter used for testing are connected to an AC power supply device, performing a regenerative operation of the power inverter used for regeneration at a time of performing the energization test of the power inverter used for testing.

A distributed-power-supply power conversion system according to this invention includes: a plurality of power inverters configured to invert DC power to AC power; and a control device configured to select at least one power inverter from the plurality of power inverters as a power inverter used for charging, configured to select, from the plurality of power inverters, a power inverter different from the power inverter used for charging as a power inverter used for testing, and configured to perform an energization test of the power inverter used for testing, an AC side of the power inverter used for charging and an AC side of the power inverter used for testing being disconnected from a system, and being connected with each other, the control device selecting, as the power inverter used for charging, the power inverter having a DC side to which a power storage facility is connected, selecting, as the power inverter used for testing, the power inverter having a DC side to which a photovoltaic power generation facility is connected and, in a state where the AC side of the power inverter used for charging and the AC side of the power inverter used for testing are connected to the AC power supply device, performing a charging operation of the power inverter used for charging at a time of performing the energization test of the power inverter used for testing.

Advantageous Effects of Invention

According to these inventions, the energization test of the power inverter can be performed before the system receives power.

DESCRIPTION OF EMBODIMENTS

Modes for carrying out this invention will be described with reference to attached drawings. In the respective drawings, identical or corresponding components are given the same reference symbols. The repetitive descriptions of such components will be simplified or omitted when appropriate.

Embodiment 1

Figure 1:
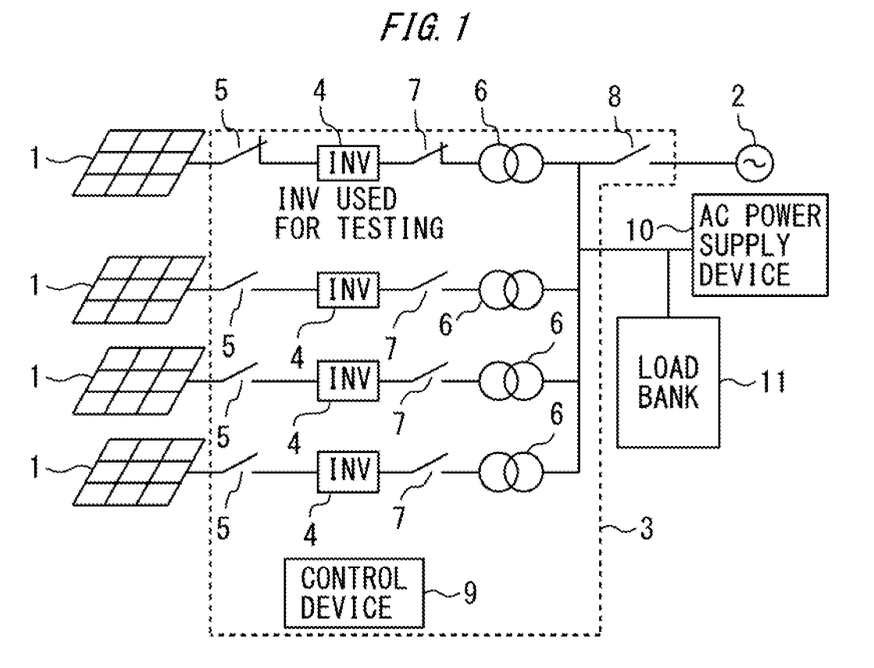
FIG. 1 is a configuration diagram of a power system to which a distributed-power-supply power conversion system according to an embodiment 1 is applied.

FIG. 1 is a configuration diagram of a power system to which a distributed-power-supply power conversion system according to an embodiment 1 is applied.

In the power system shown in FIG. 1, a plurality of photovoltaic power generation facilities 1 may be solar cells, for example, and are provided in an outdoor environment. Four photovoltaic power generation facilities 1 are shown in FIG. 1. A system 2 is operated by a power company or the like. A distributed-power-supply power conversion system 3 is connected between the plurality of photovoltaic power generation facilities 1 and the system 2.

The distributed-power-supply power conversion system 3 includes a plurality of power inverters 4, a plurality of DC-side switches 5, a plurality of transformers 6, a plurality of AC-side switches 7, a system-side switch 8, and a control device 9.

An input portion of each of the plurality of power inverters 4 is connected to an output portion of each of the plurality of photovoltaic power generation facilities 1. Each of the plurality of power inverters 4 is provided such that the power inverter 4 can invert DC power from each of the plurality of photovoltaic power generation facilities to AC power.

Each of the plurality of DC-side switches 5 is connected between each of the plurality of photovoltaic power generation facilities 1 and each of the plurality of power inverters 4. Each of the plurality of DC-side switches 5 may be a circuit breaker, for example. Each DC-side switch 5 is provided such that the DC-side switch 5 can cut the connection between each of the plurality of photovoltaic power generation facilities 1 and each of the plurality of power inverters 4 when an overcurrent occurs between each of the plurality of photovoltaic power generation facilities 1 and each of the plurality of power inverters 4.

Each of the plurality of transformers 6 is connected between each of the plurality of power inverters 4 and the system 2. Each of the plurality of transformers 6 is provided such that the transformer 6 can transform an AC voltage from each of the plurality of power inverters 4.

Each of the plurality of AC-side switches 7 is connected between each of the plurality of power inverters 4 and each of the plurality of transformers 6. Each of the plurality of AC-side switches 7 may be a circuit breaker, for example. Each AC-side switch 7 is provided such that the AC-side switch 7 can cut the connection between each of the plurality of power inverters 4 and each of the plurality of transformers 6 when an overcurrent occurs between each of the plurality of power inverters 4 and each of the plurality of transformers 6.

The system-side switch 8 is provided between the plurality of transformers 6 and the system 2. The system-side switch 8 may be a circuit breaker, for example. The system-side switch 8 is provided such that the system-side switch 8 can cut the connection between the plurality of transformers 6 and the system 2 when an overcurrent occurs between the plurality of transformers 6 and the system 2.

The control device 9 is provided such that the control device 9 can control the plurality of power inverters 4. Each of the plurality of power inverters 4 may be provided with the independent control device 9.

In the distributed-power-supply power conversion system 3, a commissioning test is performed before the system 2 receives power. Specifically, in a state where the system-side switch 8 cuts the connection between the plurality of transformers 6 and the system 2, at least one power inverter 4 is selected from the plurality of power inverters 4 as the power inverter 4 used for testing.

The AC-side switch 7 which corresponds to the power inverter 4 used for testing is maintained in a state of establishing the connection between the power inverter 4 used for testing and the transformer 6. Each of the other AC-side switches 7 is maintained in a state of cutting the connection between the power inverter 4 and the switch.

In such a state, an AC power supply device 10 and a load bank 11 are temporarily connected to the output side of the transformer 6 which corresponds to the power inverter 4 used for testing.

The DC-side switch 5 which corresponds to the power inverter 4 used for testing is maintained in a state of establishing the connection between the photovoltaic power generation facility 1 and the power inverter 4 used for testing. Each of the other DC-side switches 5 is maintained in a state of cutting the connection between the photovoltaic power generation facility 1 and the power inverter 4.

In such a state, an energization test is performed by operating the power inverter 4 used for testing by the control device 9 in a state where the AC power supply device 10 establishes a voltage on the AC side of the power inverter 4 used for testing.

After the energization test of the power inverter 4 used for testing at a current point of time is finished, the energization tests of the remaining power inverters 4 are sequentially performed by the same method.

According to the embodiment 1 described above, the energization test of the power inverter 4 used for testing is performed in a state where the AC side of the power inverter 4 used for testing is disconnected from the system 2, and is connected to the AC power supply device 10 and to the load bank 11, and a voltage on the AC side of the power inverter 4 used for testing is established. Effective power injected into the AC side is absorbed by the load bank 11. Therefore, it is possible to allow the power inverter 4 used for testing to output effective power. As a result, the energization test of the power inverter 4 can be performed before the system 2 receives power.

A generator, an AC power supply, a motor generator, a power inverter or the like may be used as the AC power supply device 10.

Output power from the power inverter 4 used for testing is consumed by the load bank 11. Therefore, it is sufficient for the AC power supply device 10 to output reactive power for maintaining an AC voltage. Rated power of the AC power supply device 10 may be smaller than that of the power inverter 4 used for testing.

Figure 2:
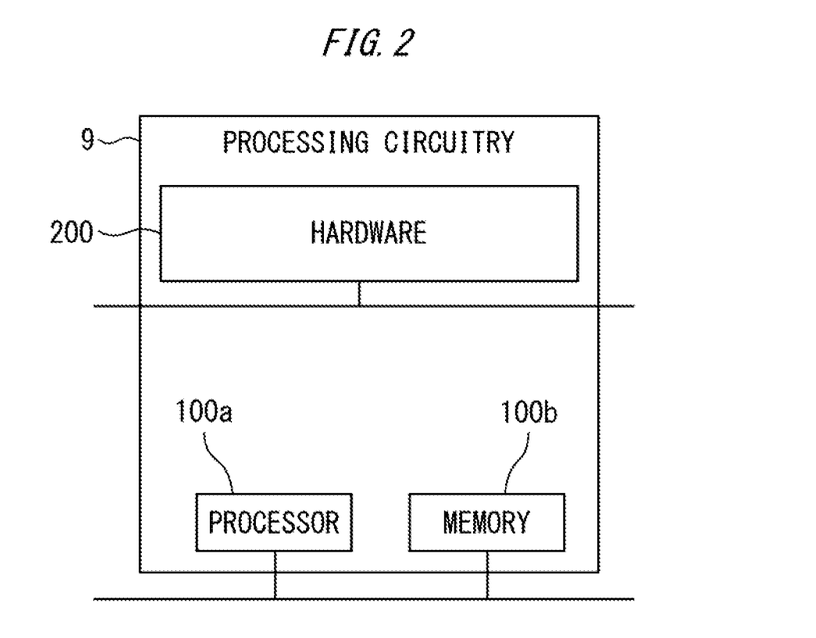
FIG. 2 is a hardware configuration diagram of a control device of the distributed-power-supply power conversion system according to the embodiment 1.

Next, an example of the control device 9 will be described with reference to FIG. 2. FIG. 2 is a hardware configuration diagram of the control device of the distributed-power-supply power conversion system according to the embodiment 1.

The respective functions of the control device 9 can be achieved by a processing circuitry. For example, the processing circuitry may include at least one processor 100*a* and at least one memory 100*b*. For example, the processing circuitry may include at least one dedicated hardware 200.

In the case where the processing circuitry includes at least one processor 100*a* and at least one memory 100*b*, the respective functions of the control device 9 is achieved by software, firmware, or a combination of the software and the firmware. At least one of the software and the firmware is referred to as a program. At least one of the software and the firmware is stored in at least one memory 100*b*. At least one processor 100*a* reads and executes the program stored in at least one memory 100*b* to achieve the respective functions of the control device 9. At least one processor 100*a* is also referred to as a central processing unit, a processing unit, an arithmetic unit, a microprocessor, a microcomputer, or a DSP. For example, at least one memory 100*b* may be a nonvolatile or volatile semiconductor memory, such as a RAM, a ROM, a flash memory, an EPROM, or an EEPROM, or may be a magnetic disk, a flexible disk, an optical disc, a compact disc, a minidisc, a DVD or the like.

In the case where the processing circuitry includes at least one dedicated hardware 200, the processing circuitry may be achieved by, for example, a single circuitry, a composite circuitry, a programmed processor, a parallel programmed processor, an ASIC, an FPGA, or a combination of the above. For example, the respective functions of the control device 9 may be respectively achieved by the processing circuitries. For example, the respective functions of the control device 9 may be collectively achieved by the processing circuitry.

Some of the respective functions of the control device 9 may be achieved by the dedicated hardware 200, and other functions may be achieved by the software or the firmware. For example, a function of controlling the power inverter 4 used for testing may be achieved by a processing circuitry formed of the dedicated hardware 200, and functions other than the function of controlling the power inverter 4 used for testing may be achieved by at least one processor 100*a* reading and executing the program stored in at least one memory 100*b*.

As described above, the processing circuitry achieves the respective functions of the control device 9 by the hardware 200, the software, the firmware, or a combination of the above.

Embodiment 2

Figure 3:
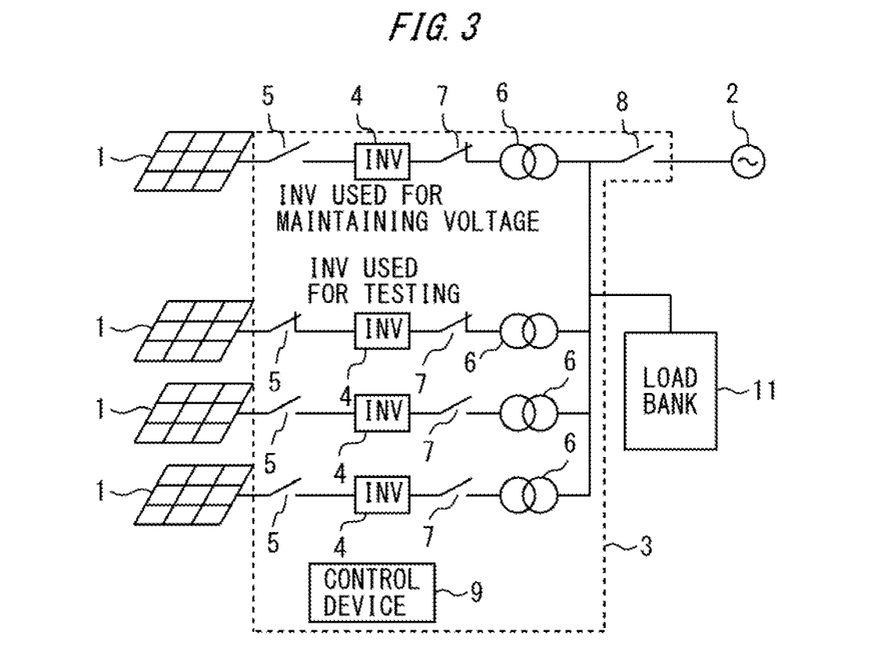
FIG. 3 is a configuration diagram of a power system to which a distributed-power-supply power conversion system according to an embodiment 2 is applied.

FIG. 3 is a configuration diagram of a power system to which a distributed-power-supply power conversion system according to an embodiment 2 is applied. Components identical or corresponding to the components in the embodiment 1 are given the same reference symbols. The description of such components will be omitted.

In the commissioning test of the distributed-power-supply power conversion system 3 of the embodiment 2, in a state where the system-side switch 8 cuts the connection between the plurality of transformers 6 and the system 2, at least one power inverter 4 is selected from the plurality of power inverters 4 as a power inverter 4 used for maintaining AC voltage. Of the plurality of power inverters 4, a power inverter 4 different from the power inverter 4 used for maintaining AC voltage is selected as the power inverter 4 used for testing.

The AC-side switch 7 which corresponds to the power inverter 4 used for maintaining AC voltage is maintained in a state of establishing the connection between the power inverter 4 used for maintaining AC voltage and the transformer 6. The AC-side switch 7 which corresponds to the power inverter 4 used for testing is maintained in a state of establishing the connection between the power inverter 4 used for testing and the transformer 6. Each of the other AC-side switches 7 is maintained in a state of cutting the connection between the power inverter 4 and the transformer 6.

In such a state, the load bank 11 is temporarily connected to the output side of the transformer 6 which corresponds to the power inverter 4 used for maintaining AC voltage and to the output side of the transformer 6 which corresponds to the power inverter 4 used for testing.

The DC-side switch 5 which corresponds to the power inverter 4 used for maintaining AC voltage is maintained in a state of cutting the connection between the photovoltaic power generation facility 1 and the power inverter 4 used for maintaining voltage. The DC-side switch 5 which corresponds to the power inverter 4 used for testing is maintained in a state of establishing the connection between the photovoltaic power generation facility 1 and the power inverter 4 used for testing. Each of the other DC-side switches 5 is maintained in a state of cutting the connection between the photovoltaic power generation facility 1 and the power inverter 4.

In such a state, the control device 9 performs the energization test of the power inverter 4 used for testing while controlling the power inverter 4 used for maintaining AC voltage such that the power inverter 4 used for maintaining AC voltage has a constant voltage on the AC side. The power inverter 4 used for maintaining AC voltage controls the voltage on the AC side by outputting reactive power.

After the energization test of the power inverter 4 used for testing at a current point of time is finished, the energization tests of the remaining power inverters 4 are sequentially performed by the same method.

According to the embodiment 2 described above, in a state where the AC side of the power inverter 4 used for maintaining voltage and the AC side of the power inverter 4 used for testing are connected to the load bank 11, the power inverter 4 used for maintaining AC voltage is controlled such that the power inverter 4 used for maintaining voltage has a constant voltage on the AC side at the time of performing the energization test of the power inverter 4 used for testing. Further, effective power injected into the AC side is consumed by the load bank 11. Therefore, it is possible to allow the power inverter 4 used for testing to output effective power. Accordingly, before the system 2 receives power, the energization test of the power inverter 4 can be performed without requiring the AC power supply device 10.

In the embodiment 2, it is sufficient that at least two power inverters 4 have an autonomous operation function or an AVR mode function. The power inverter 4 having the autonomous operation function is expensive due to authentication or the like. For this reason, with the use of the power inverter 4 having the AVR mode function, the energization test of the power inverter 4 can be performed at a low cost.

Embodiment 3

Figure 4:
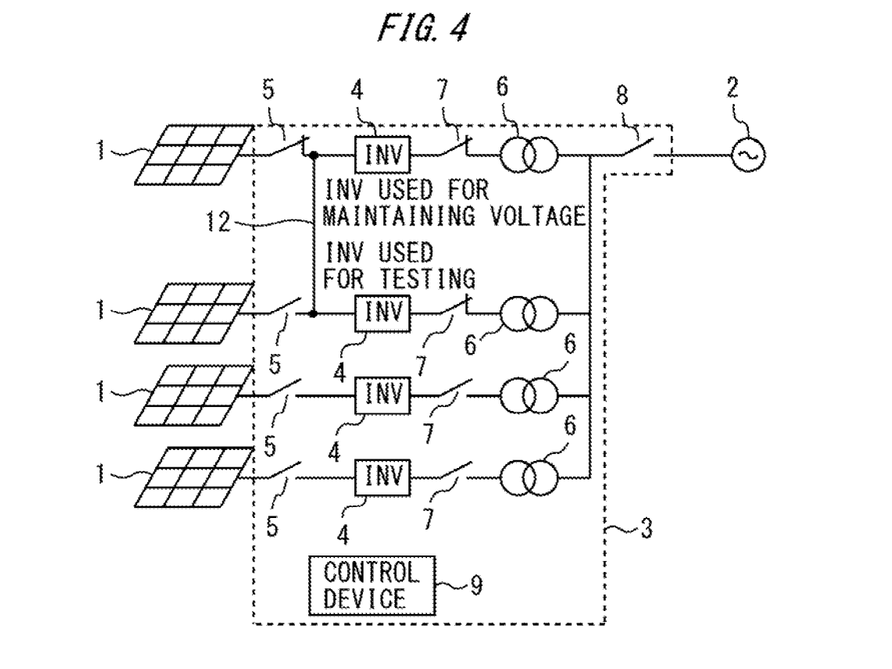
FIG. 4 is a configuration diagram of a power system to which a distributed-power-supply power conversion system according to an embodiment 3 is applied.

FIG. 4 is a configuration diagram of a power system to which a distributed-power-supply power conversion system according to an embodiment 3 is applied. Components identical or corresponding to the components in the embodiment 2 are given the same reference symbols. The description of such components will be omitted.

In the commissioning test of the distributed-power-supply power conversion system 3 of the embodiment 3, the AC-side switch 7 which corresponds to the power inverter 4 used for maintaining AC voltage is maintained in a state of establishing the connection between the power inverter 4 used for maintaining AC voltage and the transformer 6. The AC-side switch 7 which corresponds to the power inverter 4 used for testing is maintained in a state of establishing the connection between the power inverter 4 used for testing and the transformer 6.

In such a state, the DC side of the power inverter 4 used for maintaining AC voltage and the DC side of the power inverter 4 used for testing are temporarily connected via a test cable 12.

The DC-side switch 5 which corresponds to the power inverter 4 used for maintaining AC voltage is maintained in a state of establishing the connection between the photovoltaic power generation facility 1 and the power inverter 4 used for maintaining AC voltage. The DC-side switch 5 which corresponds to the power inverter 4 used for testing is maintained in a state of cutting the connection between the photovoltaic power generation facility 1 and the power inverter 4 used for testing.

In such a state, the control device 9 performs the energization test of the power inverter 4 used for testing while controlling the power inverter 4 used for maintaining AC voltage such that the power inverter 4 used for maintaining AC voltage has a constant voltage on the AC side.

After the energization test of the power inverter 4 used for testing at a current point of time is finished, the energization tests of the remaining power inverters 4 are sequentially performed by the same method.

According to the embodiment 3 described above, in a state where the DC side of the power inverter 4 used for testing and the DC side of the power inverter 4 used for maintaining AC voltage are used in common, the power inverter 4 used for maintaining AC voltage is controlled such that the power inverter 4 used for maintaining AC voltage has a constant voltage on the AC side at the time of performing the energization test of the power inverter 4 used for testing. Further, AC power generated by the power inverter 4 used for testing is converted to DC power by the power inverter 4 used for maintaining AC voltage, and is applied to the DC side of the power inverter 4 used for testing again. Therefore, before the system 2 receives power, the energization test of the power inverter 4 can be performed without requiring either the AC power supply device 10 or the load bank 11.

Embodiment 4

Figure 5:
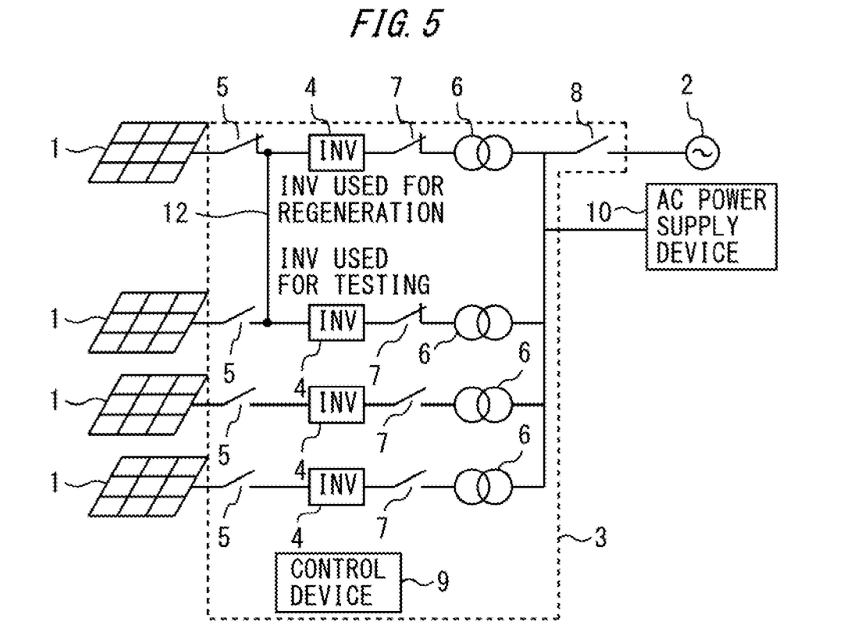
FIG. 5 is a configuration diagram of a power system to which a distributed-power-supply power conversion system according to an embodiment 4 is applied.

FIG. 5 is a configuration diagram of a power system to which a distributed-power-supply power conversion system according to an embodiment 4 is applied. Components identical or corresponding to the components in the embodiment 3 are given the same reference symbols. The description of such components will be omitted.

In the commissioning test of the distributed-power-supply power conversion system 3 of the embodiment 4, the AC power supply device 10 is connected to the output side of the transformer 6 which corresponds to a power inverter 4 used for regeneration and to the output side of the transformer 6 which corresponds to the power inverter 4 used for testing.

In such a state, with the AC power supply device 10 establishing the voltage on the AC side of the power inverter 4 used for testing, the energization test of the power inverter 4 used for testing is performed by the control device 9 while the regenerative operation of the power inverter 4 used for regeneration is performed by the control device 9 such that power generated by the power inverter 4 used for testing is regenerated to the DC side.

After the energization test of the power inverter 4 used for testing at a current point of time is finished, the energization tests of the remaining power inverters 4 are sequentially performed by the same method.

According to the embodiment 4 described above, in a state where the AC side of the power inverter 4 used for regeneration and the AC side of the power inverter 4 used for testing are connected to the AC power supply device 10, the regenerative operation of the power inverter 4 used for regeneration is performed at the time of performing the energization test of the power inverter 4 used for testing. Therefore, before the system 2 receives power, the energization test of the power inverter 4 can be performed by the AC power supply device 10 with a small capacity.

Embodiment 5

Figure 6:
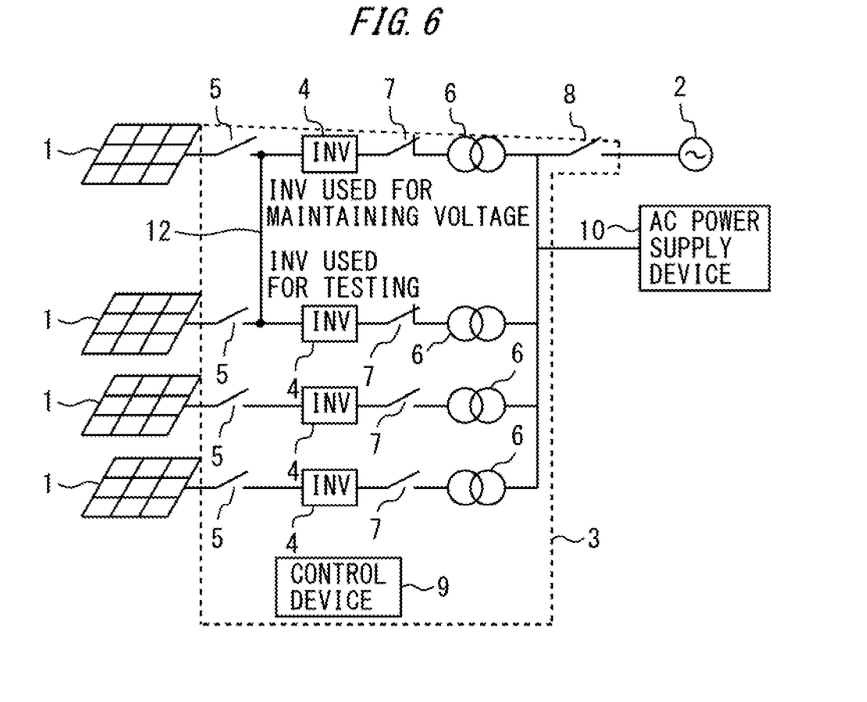
FIG. 6 is a configuration diagram of a power system to which a distributed-power-supply power conversion system according to an embodiment 5 is applied.

FIG. 6 is a configuration diagram of a power system to which a distributed-power-supply power conversion system according to an embodiment 5 is applied. Components identical or corresponding to the components in the embodiment 4 are given the same reference symbols. The description of such components will be omitted.

In the commissioning test of the distributed-power-supply power conversion system 3 of the embodiment 5, the DC-side switch 5 which corresponds to the power inverter 4 used for maintaining DC voltage is maintained in a state of cutting the connection between the photovoltaic power generation facility 1 and the power inverter 4 used for maintaining DC voltage.

In such a state, with the AC power supply device 10 establishing the voltage on the AC side of the power inverter 4 used for testing, the control device 9 performs the energization test of the power inverter 4 used for testing while controlling the power inverter 4 used for maintaining DC voltage such that the power inverter 4 used for maintaining DC voltage has a constant voltage on the DC side.

After the energization test of the power inverter 4 used for testing at a current point of time is finished, the energization tests of the remaining power inverters 4 are sequentially performed by the same method.

According to the embodiment 5 described above, in a state where the DC side of the power inverter 4 used for maintaining DC voltage and the DC side of the power inverter 4 used for testing are connected with each other, and the AC side of the power inverter 4 used for maintaining DC voltage and the AC side of the power inverter 4 used for testing are connected to the AC power supply device 10, the power inverter 4 used for maintaining DC voltage is controlled such that the power inverter 4 used for maintaining DC voltage has a constant voltage on the DC side at the time of performing the energization test of the power inverter 4 used for testing. Therefore, even when the connection with a DC power supply is not established before the system 2 receives power, the energization test of the power inverter 4 can be performed by the AC power supply device 10 with a small capacity.

Embodiment 6

Figure 7:
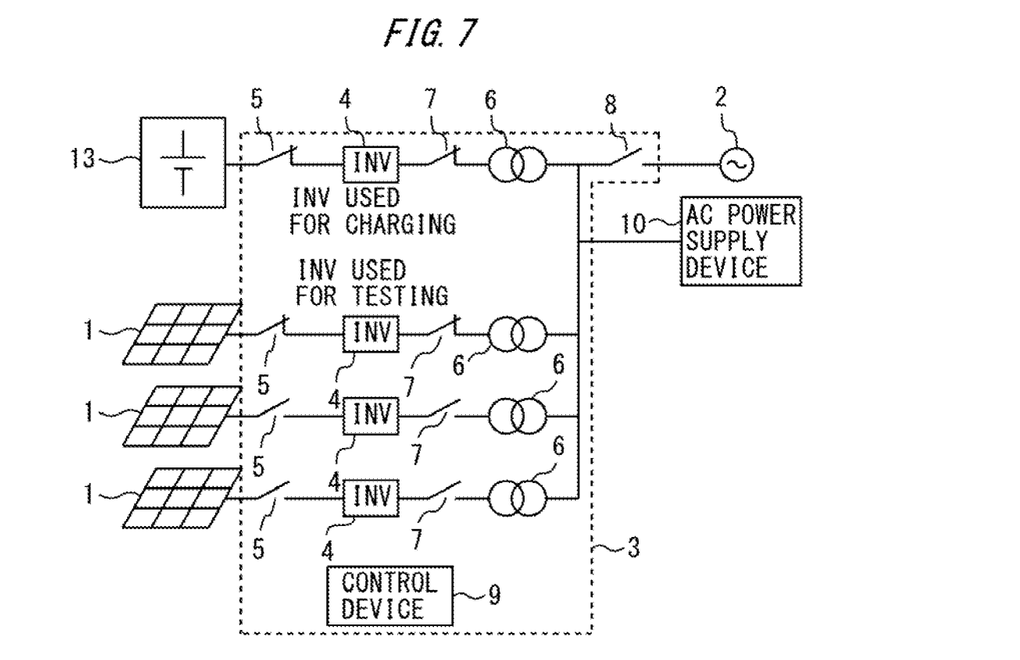
FIG. 7 is a configuration diagram of a power system to which a distributed-power-supply power conversion system according to an embodiment 6 is applied.

FIG. 7 is a configuration diagram of a power system to which a distributed-power-supply power conversion system according to an embodiment 6 is applied. Components identical or corresponding to the components in the embodiment 2 are given the same reference symbols. The description of such components will be omitted.

In the commissioning test of the distributed-power-supply power conversion system 3 of the embodiment 6, in a state where the system-side switch 8 cuts the connection between the plurality of transformers 6 and the system 2, the power inverter 4 having the DC side to which a power storage facility 13 is connected is selected as a power inverter 4 used for charging. Of the plurality of power inverters 4, a power inverter 4 different from the power inverter 4 used for charging is selected as the power inverter 4 used for testing.

The DC-side switch 5 which corresponds to the power inverter 4 used for charging is maintained in a state of establishing the connection between the power storage facility 13 and the power inverter 4 used for charging. The DC-side switch 5 which corresponds to the power inverter 4 used for testing is maintained in a state of establishing the connection between the photovoltaic power generation facility 1 and the power inverter 4 used for testing.

The AC power supply device 10 is connected to the output side of the transformer 6 which corresponds to the power inverter 4 used for charging and to the output side of the transformer 6 which corresponds to the power inverter 4 used for testing.

In such a state, with the AC power supply device 10 establishing the voltage on the AC side of the power inverter 4 used for testing, the energization test of the power inverter 4 used for testing is performed by the control device 9 while the charging operation of the power inverter 4 used for charging is performed by the control device 9 such that the power inverter 4 used for charging is charged with power generated by the power inverter 4 used for testing.

After the energization test of the power inverter 4 used for testing at a current point of time is finished, the energization tests of the remaining power inverters 4 are sequentially performed by the same method.

Power charged into the power storage facility 13 may be discharged by a discharging resistor which is provided on the DC side or the AC side.

According to the embodiment 6 described above, in a state where the AC side of the power inverter 4 used for charging and the AC side of the power inverter 4 used for testing are connected to the AC power supply device 10, the regenerative operation of the power inverter 4 used for charging is performed at the time of performing the energization test of the power inverter 4 used for testing. Therefore, before the system 2 receives power, the energization test of the power inverter 4 can be performed while power from the photovoltaic power generation facility 1 and the AC power supply device 10 with a small capacity is absorbed by the power storage facility 13.

Embodiment 7

Figure 8:
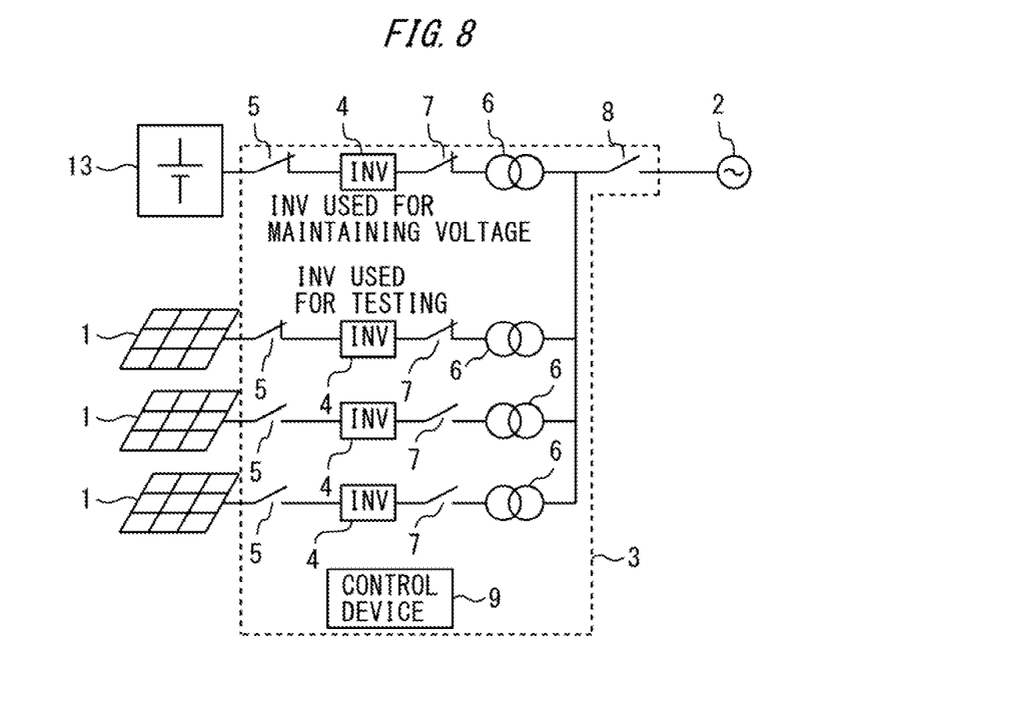
FIG. 8 is a configuration diagram of a power system to which a distributed-power-supply power conversion system according to an embodiment 7 is applied.

FIG. 8 is a configuration diagram of a power system to which a distributed-power-supply power conversion system according to an embodiment 7 is applied. Components identical or corresponding to the components in the embodiment 6 are given the same reference symbols. The description of such components will be omitted.

In the commissioning test of the distributed-power-supply power conversion system 3 of the embodiment 7, the control device 9 performs the energization test of the power inverter 4 used for testing while controlling the power inverter 4 used for maintaining AC voltage such that the power inverter 4 used for maintaining AC voltage has a constant voltage on the AC side.

After the energization test of the power inverter 4 used for testing at a current point of time is finished, the energization tests of the remaining power inverters 4 are sequentially performed by the same method.

According to the embodiment 7 described above, the power inverter 4 used for maintaining AC voltage is controlled such that the power inverter 4 used for maintaining AC voltage has a constant voltage on the AC side at the time of performing the energization test of the power inverter 4 used for testing. Therefore, before the system 2 receives power, the energization test of the power inverter 4 can be performed without requiring the AC power supply device 10 while power from the photovoltaic power generation facility 1 is absorbed by the power storage facility 13.

It is noted that, in the embodiment 1 to the embodiment 7, the energization test of the power inverter 4 may be performed by the same method even without the transformer 6.

Further, in the embodiment 2 to the embodiment 7, it may be configured such that a plurality of power inverters 4 for maintaining voltage are divided into groups, and the energization test of the power inverter 4 used for testing may be simultaneously performed in a plurality of groups. In this case, all energization tests of the power inverters 4 can be finished within a short period of time.

INDUSTRIAL APPLICABILITY

As described above, the distributed-power-supply power conversion system according to this invention can be utilized in a power system.

REFERENCE SIGNS LIST

1 photovoltaic power generation facility
2 system
3 distributed-power-supply power conversion system
4 power inverter
5 DC-side switch
6 transformer
7 AC-side switch
8 system-side switch
9 control device
10 AC power supply device
11 load bank
12 test cable
13 power storage facility
100*a* processor
100*b* memory
200 hardware

The invention claimed is:

1. A distributed-power-supply power conversion system comprising:
   a plurality of power inverters configured to invert DC power to AC power; and
   a control device configured to select at least one power inverter from the plurality of power inverters as a power inverter used for testing, and configured to perform an energization test of the power inverter used for testing in a state where an AC side of the power inverter used kw testing is disconnected from a system, and is connected to an AC power supply device and to a load bank, and a voltage on the AC side of the power inverter used for testing is established.

2. A distributed-power-supply power conversion system comprising:
   plurality of power inverters configured to invert DC power to AC power; and
   a control device configured to select at least one power inverter from the plurality of power inverters as a power inverter used for maintaining voltage, configured to select, from the plurality of power inverters, a power inverter different from the power inverter used for maintaining voltage as a power inverter used for testing, and configured to perform an energization test of the power inverter used for testing, an AC side of the power inverter used for maintaining voltage and an AC side of the power inverter used for testing being disconnected from a system, and being connected with each other,
   the control device selecting, as the power inverter used for maintaining voltage, the power inverter having a DC side to which a photovoltaic power generation facility is connected, selecting, as the power inverter used for testing, the power inverter having a DC side to which the photovoltaic power generation facility is connected, and controlling the power inverter used for maintaining voltage such that the power inverter used for maintaining voltage has a constant voltage on the AC side at a time of performing the energization test of the power inverter used for testing.

3. A distributed-power-supply power conversion system comprising:
   a plurality of power inverters configured to invert DC power to AC power; and
   a control device configured to select at least one power inverter from the plurality of power inverters as a power inverter used for maintaining voltage, configured to select, from the plurality of power inverters, a power inverter different from the power inverter used for maintaining voltage as a power inverter used for testing, and configured to perform an energization test of the power inverter used for testing, an AC side of the power inverter used for maintaining voltage and an AC side of the power inverter used for testing being disconnected from a system, and being connected with each other,
   the control device selecting, as the power inverter used for maintaining voltage, the power inverter having a DC side to which a power storage facility is connected, selecting, as the power inverter used for testing, the power inverter having a DC side to which a photovoltaic power generation facility is connected, and controlling the power inverter used for maintaining voltage such that the power inverter used for maintaining voltage has a constant voltage on the AC side at a time of performing the energization test of the power inverter used for testing.

* * * * *